US006724058B2

(12) United States Patent
Aigner et al.

(10) Patent No.: US 6,724,058 B2
(45) Date of Patent: Apr. 20, 2004

(54) METHOD FOR PRODUCING A FILLED RECESS IN A MATERIAL LAYER, AND AN INTEGRATED CIRCUIT CONFIGURATION PRODUCED BY THE METHOD

(75) Inventors: Robert Aigner, München (DE); Klaus-Günter Oppermann, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/756,532

(22) Filed: Jan. 8, 2001

(65) Prior Publication Data

US 2001/0005032 A1 Jun. 28, 2001

Related U.S. Application Data

(63) Continuation of application No. PCT/DE99/02041, filed on Jul. 2, 1999.

(30) Foreign Application Priority Data

Jul. 8, 1998 (DE) ........................................ 198 30 535

(51) Int. Cl.[7] ........................ H01L 27/108; H01L 27/01; H01L 29/82; H01L 29/00

(52) U.S. Cl. ........................ 257/415; 257/513; 257/301; 257/353; 257/417; 257/418; 257/419; 438/50; 438/53

(58) Field of Search ................................ 257/415, 513, 257/301, 353, 417–419; 438/50, 53

(56) References Cited

U.S. PATENT DOCUMENTS

| | | | | |
|---|---|---|---|---|
| 4,753,901 A | | 6/1988 | Ellsworth et al. | |
| 5,194,402 A | * | 3/1993 | Ehrfeld et al. | 437/180 |
| 5,324,683 A | | 6/1994 | Fitch et al. | |
| 5,358,891 A | | 10/1994 | Tsang et al. | |
| 5,374,583 A | | 12/1994 | Lur et al. | |
| 5,395,790 A | | 3/1995 | Lur | |
| 5,576,250 A | | 11/1996 | Diem et al. | |
| 5,610,431 A | * | 3/1997 | Martin | 257/415 |
| 5,665,622 A | | 9/1997 | Muller et al. | |
| 5,760,455 A | * | 6/1998 | Hierold et al. | 257/415 |
| 6,140,689 A | * | 10/2000 | Sheiter et al. | 257/414 |
| 6,184,560 B1 | * | 2/2001 | Kawai | 257/415 |

FOREIGN PATENT DOCUMENTS

| | | |
|---|---|---|
| DE | 195 09 868 A1 | 9/1996 |
| DE | 196 36 914 A1 | 3/1998 |
| EP | 0 021 147 A2 | 1/1981 |
| EP | 0 340 524 A1 | 11/1989 |
| EP | 0 862 207 A1 | 9/1998 |
| JP | 09 008 039 A | 1/1997 |

OTHER PUBLICATIONS

P. R. Scheeper et al.: "A review of silicon microphones", Sensors and Actuators vol. A 44, 1994, pp. 1–11.

J.W. Weigold et al.: "Fabrication of Thick Si Resonators with a Frontside–Release Etch–Diffusion Process", Journal Microelectromechanical Systems, vol. 7, No. 2, Jun. 1998, pp. 201–206.

* cited by examiner

*Primary Examiner*—Jerome Jackson
*Assistant Examiner*—Joseph Nguyen
(74) *Attorney, Agent, or Firm*—Laurence A. Greenberg; Werner H. Stemer; Ralph E. Locher

(57) ABSTRACT

A recess is produced in a material layer by creating at least a first and a second structure in various steps. The layers define each other laterally and extend to the bottom of the recess. The first structure and the second structure are so narrow that they can be made by creating conformally produced layers that have an independent thickness and are smaller than the depth of the recess. The conformally produced layers are formed in an appropriate deposition process. A covering structure can be produced on top of the first and second structure. An opening can be made in the covering structure, through which the first structure and the second structure can be removed in an etching step.

4 Claims, 5 Drawing Sheets

METHOD FOR PRODUCING A FILLED RECESS IN A MATERIAL LAYER, AND AN INTEGRATED CIRCUIT CONFIGURATION PRODUCED BY THE METHOD

CROSS-REFERENCE TO RELATED APPLICATION

This is a continuation of copending International Application PCT/DE99/02041, filed Jul. 2, 1999, which designated the United States and which was not published in the English language.

BACKGROUND OF THE INVENTION

Field of the Invention

The invention relates to a method for producing a filled recess in a material layer, and to an integrated circuit configuration produced by the method.

There are a large number of integrated circuit configurations for which it is advantageous to have a recess with dimensions of at least a few μm.

By way of example, such a circuit configuration encompasses a CMOS microphone in which a recess forms a cavity, the so-called rear volume, above which a diaphragm is disposed that is made to oscillate by sound waves. A capacitor is used to convert the oscillations into electrical signals. The greater the volume of the recess, the easier it is for the diaphragm to oscillate and the lower the sound levels that can be detected. For microphones, it is accordingly desirable to provide as deep a recess as possible having a large horizontal cross section.

The reference by P. R. Scheeper et al., titled "A Review of Silicon Microphones", Sensors and Actuators A 44 1994, pages 1 to 11, describes a first microphone, in which a recess serving as rear volume is produced in a first silicon substrate. In a second silicon substrate, a perforated cover layer and, above that, a diaphragm is produced. The first silicon substrate is connected to the second silicon substrate. A capacitance is formed by the cover layer and the first silicon substrate. Since the recess and the cover layer are produced in separate substrates, the process complexity is very high. Connecting the substrates requires high temperatures, which can impair the process reliability.

These disadvantages are avoided in a second microphone described in the aforementioned patent application. The cover layer and the recess are produced in a single substrate. To this end, the recess is filled with a sacrificial layer. A perforated cover layer is produced above the sacrificial layer, and a diaphragm is produced above this perforated cover layer. The sacrificial layer is then removed through an opening at the edge of the diaphragm by etching.

If a circular plane whose diameter is equivalent to at least the depth of a recess fits into a horizontal cross section of the recess, then the thickness of a conformally deposited layer must be at least the depth of the recess for the recess to be filled by the layer. In the case of microphones, the associated recesses usually have the dimension described.

In general, however, deposition of a layer thicker than a few μm results in the layer peeling off or in the formation of cracks in the layer. Furthermore, the circuit configuration in question can become buckled on account of stresses in a layer. Not least, depositing a thick layer requires a high input of time and cost. Hence, recesses that are filled at some time or other have dimensions below a few μm in the prior art.

Since, in the second microphone, the recess is filled during the production method by depositing the sacrificial layer, it is shallow, in contrast to the recess in the first microphone. The rear volume of the second microphone is correspondingly smaller than in the first microphone.

Other integrated circuit configurations for which it is advantageous to have a recess with dimensions of at least a few Mm encompass, by way of example, micromechanical components such as rotation rate sensors or acceleration sensors, which have moving structures which are disposed in cavities and for which attempts are made to obtain the greatest possible freedom of movement. Published, Non-Prosecuted German Patent Application DE 195 09 868 A1 describes a production method for such micromechanical components. On a substrate, a bottom sacrificial layer is produced, and a structure layer is produced above this and is patterned, which produces a structure surrounded by a recess. The recess is filled by depositing a top sacrificial layer, above which a cover layer is applied. Etching holes in the cover layer are used to remove the sacrificial layers, and the recess forms part of a cavity in which the structure can move.

In the case of the acceleration sensor or the rotation rate sensor, vibration or rotation is detected using the structure, which can be made to oscillate laterally. The cover layer serves to protect the circuit configuration. The sensitivity of the acceleration sensor or of the rotation rate sensor is higher the thicker the structure, i.e. the deeper the recess.

SUMMARY OF THE INVENTION

It is accordingly an object of the invention to provide a method for producing a filled recess in a material layer, and an integrated circuit configuration produced by the method that overcome the above-mentioned disadvantages of the prior art devices and methods of this general type, in which a filled recess having a depth of at least a few μm can be produced in a material layer, the recess having a horizontal cross section in which at least one circular plane with a diameter of a few μm fits.

With the foregoing and other objects in view there is provided, in accordance with the invention, a method for producing a filled recess. The method includes providing a material layer, and removing a portion of the material layer in a region provided for a recess to be created until a bottom of the recess is exposed, thereby creating a first trench having a horizontal cross-section being smaller than the recess. A first filling layer is deposited substantially conformally and has a depth that is less than approximately half of a depth of the recess in an area where the portion of the material layer has been removed for forming a first structure forming part of a filling of the recess. A remaining portion of the material layer in the region is removed resulting in a second trench having a horizontal cross-section being smaller than the recess to be created. A second filling layer is deposited substantially conformally and has a depth that is less than approximately half of the depth of the recess for forming a second structure in an area where the remaining portion of the material layer in the region has been removed and the second structure forms a further part of the filling of the recess. The second structure is laterally adjacent the first structure.

In the method according to the invention, at least one first structure and at least one second structure are produced in a region provided for the recess. The structures adjoin one another at the sides and form a filling in the recess, and each of the parts of the structures have respectively opposite side parts whose distance from one another is shorter than approximately half of a depth of the recess. The recess is not, as in the prior art, produced first and then filled in one step, which is the reason why the deposition of a thick layer with all its disadvantages is avoided. The method according to the invention permits the production of filled deep recesses having large horizontal cross sections.

Such a method is advantageous for any technical field in which recesses are filled by essentially conformal layers. Such a field is semiconductor process technology, for example.

The described dimensions of the first structure and of the second structure permit the structures to be produced by method steps which are independent of the depth of the recess.

To produce the first structure, at least one narrow recess is first produced in a region, which is provided for the recess, of the material layer by removing a portion of the material layer. The narrow recess has a smaller horizontal cross section than the recess to be produced and forms part of the recess to be produced. Next, side-forming layered parts of the first structure are produced which are thickened at the sides until the parts meet one another and thereby form the first structure. A boundary between the abutting parts is therefore situated inside the first structure. The first structure is produced either in the narrow recess or outside the narrow recess. The second structure is produced by first producing side-forming layered parts of the second structure which are thickened at the sides until the parts meet one another and thereby form the second structure. Producing the first structure and the second structure, which extend as far as a bottom of the recess, forms the filled recess.

The first structure and the second structure are produced in corresponding narrow recesses filled by depositing an essentially conformal filling layer. The filling layer is produced, among other things, first on the sides of the narrow recess and there forms the side-forming layered parts of the structures. In the further course of deposition, these parts are thickened at the sides in the direction of the center of the narrow recess until opposite parts meet one another and the narrow recess is filled. The short distance of the side parts from one another results in that the minimum thickness of the filling layer is determined by this distance and not by the depth of the narrow recess. It is merely half of this distance. The filling layer can therefore have a much smaller thickness than a thickness of a layer which would be necessary for filling the entire recess in one step.

The first structure is meandrous, for example, and winds its way through the recess. In this case, the second structure is likewise meandrous, for example. Alternatively, there are a multiplicity of strip-like second structures which are disposed in the windings of the first structure. For the second structures, a correspondingly large number of narrow recesses are produced. It is also possible to provide a multiplicity of first structures that, by way of example, are cylindrical or strip-like. The shapes described are examples from an unlimited number of shapes that satisfy the aforementioned condition for the side parts and are likewise within the scope of the invention.

It is within the scope of the invention if further structures are produced which, together with the first structures and the second structures, fill the recess.

The first structure can be produced in the narrow recess by filling the narrow recess by an essentially conformal deposition of a first filling layer. A further narrow recess is then produced by removing the parts of the material layer which are disposed between sides of the first structure. The second structure is produced by filling the further narrow recess by an essentially conformal deposition of a second filling layer.

So that these parts of the material layer which are disposed between the sides of the first structure can be removed, it is expedient to remove parts of the first filling layer which are situated above the parts of the material layer. The narrow recess can be produced by etching the material layer in a manner that is selective with respect to the first filling layer. The aforementioned parts of the first filling layer can be removed by masked etching. Alternatively, the first filling layer is subjected to chemical mechanical polishing until the material layer is exposed. In this case, when the narrow recess is produced, a mask covers parts of the material layer which are situated outside the region provided for the recess.

A circuit configuration according to the invention may encompass the filled recess. Alternatively, the filling in the recess is used as a sacrificial layer and is removed in a later process step.

Above the filled recess, it is possible to produce a cover structure that is situated entirely outside the recess and has an opening produced in it. Using the opening, the first structure and the second structure can be removed by etching, gas a result of which the recess forms a cavity. In the prior art, it was previously only possible to produce such cavity-forming recesses with large dimensions by processing a substrate on two sides, which requires a considerably higher level of process complexity.

To reduce the process complexity, it is advantageous if the first structure and the second structure are made of the same material. Removal can then take place in one etching step. If the etching step is isotropic, then it is advantageous if the first structure and the second structure can be etched selectively with respect to the material layer.

The material layer can be used to produce a moving structure. To this end, a bottom sacrificial layer is applied on a semiconductor substrate and is patterned. The material layer is applied on the bottom sacrificial layer. Producing the filled recess forms the structure from the material layer, the structure being surrounded at the sides by the recess. The first structure and the second structure form part of a top sacrificial layer that adjoins the bottom sacrificial layer. To this end, the narrow recess is produced such that it extends as far as the bottom sacrificial layer and cuts through the material layer. The cover structure with the opening is applied on the top sacrificial layer, which covers the structure. Using the opening in the cover structure, the top sacrificial layer and the bottom sacrificial layer are removed, as a result of which the recess forms a first part of the cavity, which has at least further parts disposed below and above the structure.

So that the structure is not entirely free to move in the cavity, supports or suspensions may be provided which connect the structure to the substrate or to the cover structure. To produce a support, an opening is produced in the bottom sacrificial layer, the opening extending as far as the substrate. When the material layer is deposited, the opening is filled. The filled opening forms the support that connects the material layer to the substrate. To produce a suspension, an opening is produced in the top sacrificial layer, the opening extending as far as the structure. When the cover structure is deposited, the opening is filled. The filled opening forms the suspension that connects the structure to the cover structure.

Fault tolerances in the process steps result in that the structures forming the filling in the recess usually do not have the same thickness. For this reason, in a circuit configuration produced using the method according to the invention, a bottom of the recess may have mutually adjacent regions, above which one of the structures has been respectively produced during the method and which are situated at different depths. The dimensions of the structures result in that each of the parts of these regions has respectively opposite edges whose distance from one another is shorter than a few μm. Since a difference in depth between the regions can be attributed to the fault tolerances, it is much smaller than the depths of the regions, i.e. than the depths of the recess. If no bottom sacrificial layer is provided, then the shape of the bottom is also retained when the structures are removed during the production method.

If the first structures and the second structures are strip-like, first regions among the regions at the bottom of the recess can be strip-like, can run essentially parallel to one another and can cross the recess. Second regions among the regions of the bottom of the recess are disposed between the first regions. The bottom in each first region has a cuboidal shallow projection that is much longer than it is wide.

If it is not planarized, a top face of the filling layer for the second structure has a slight indentation along a center line of the associated narrow recess. If the cover structure is deposited onto the filling layer, then a bottom face of the cover structure which faces the recess has a corresponding projection that fills the indentation. The projection tapers toward the bottom and is much smaller than the depth of the recess.

If the narrow recesses have the shape of strip-like trenches running parallel to one another, then, during deposition of the filling layer for the second structures, grooves are formed along center lines of the trenches in a top face of this filling layer. The cover structure deposited above the latter fills the grooves and consequently has projections there in the form of ridges.

It is within the scope of the invention if the recess has a depth that is greater than approximately 5 μm. It is within the scope of the invention if the recess has horizontal dimensions that exceed approximately 10 μm.

It is within the scope of the invention if the circuit configuration encompasses a rotation rate sensor or an acceleration sensor in which the moving structure can be made to oscillate laterally.

It is within the scope of the invention if the circuit configuration encompasses a microphone in which the recess serves as rear volume and in which the cover structure is a perforated electrode. By way of example, a diaphragm disposed above the cover structure serves as further electrode.

It is within the scope of the invention if the circuit configuration is a thermal sensor. A temperature measurement point is disposed above the recess so that a flow of heat between the temperature measurement point and the substrate is as small as possible.

It is within the scope of the invention if the circuit configuration is a radio-frequency coil. The radio-frequency coil is disposed above the recess, which is filled with insulating material, so that a capacitance between the radio-frequency coil and the semiconductor substrate is as small as possible.

It is within the scope of the invention if the circuit configuration is a pump or a valve for gases or liquids. The recess acts as a flow channel.

The first structure and the second structure may contain an oxide.

In accordance with an added feature of the invention, the first structure is one of a plurality of first structures produced and the second structure is one of a plurality of second structures produced.

In accordance with an additional feature of the invention, there are the steps of producing the first structure and the second structure as parts of a top sacrificial layer; applying a cover structure on the top sacrificial layer; forming at least one opening in the cover structure; and using an etchant supplied through the opening for removing the top sacrificial layer, as a result of which the recess forms a cavity.

In accordance with another feature of the invention, there are the steps of providing a semiconductor substrate; applying a bottom sacrificial layer on the semiconductor substrate; patterning the bottom sacrificial layer; applying the material layer on the bottom sacrificial layer; forming the first recess in the material layer such that the first recess extends as far as the bottom sacrificial layer and cuts through the material layer; and using the opening in the cover structure to remove the top sacrificial layer and the bottom sacrificial layer with the aid of the etchant, as a result of which the recess forms part of the cavity that has at least one further part disposed below the material layer.

With the foregoing and other objects in view there is further provided, in accordance with the invention, an integrated circuit configuration, containing a material layer having a recess formed therein. The recess has a depth of at least a few μm deep and a horizontal cross section in which at least one circular plane having a diameter of a few μm fits. The recess has a bottom with mutually adjacent regions, each of the mutually adjacent regions have opposite edges whose distance from one another is shorter than a few μm. A cover structure is disposed above and outside the recess for forming at least part of a cavity. The cover structure has a bottom face facing the recess. The bottom face has at least one projection tapering towards the bottom of the recess. The projection is smaller than the depth of the recess and is disposed above one of the mutually adjacent regions on the bottom of the recess. The projection has a path substantially coinciding with a path of a center line of the one of the mutually adjacent regions.

In accordance with a concomitant feature of the invention, the invention includes a component being one of:

a) a rotation rate sensor having a semiconductor structure with sides which can be made to oscillate laterally and is surrounded at the sides by the recess, and the recess forms part of the cavity;

b) an acceleration sensor having a semiconductor structure with sides which can be made to oscillate laterally and is surrounded at the sides by the recess, and the recess forms part of the cavity; and c) a microphone, the recess serving as a rear volume of the microphone and the cover structure serving as a perforated electrode.

Other features which are considered as characteristic for the invention are set forth in the appended claims.

Although the invention is illustrated and described herein as embodied in a method for producing a filled recess in a material layer, and an integrated circuit configuration produced by the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
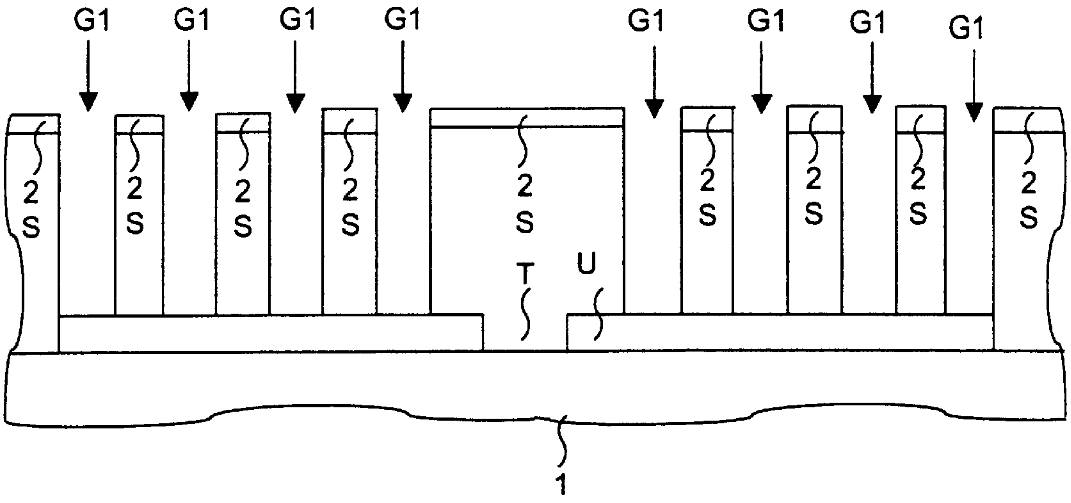
FIG. 1 is a diagrammatic, cross-sectional view through a first substrate after a bottom sacrificial layer, a layer, a support, a first mask and first trenches have been produced according to the invention.

In all the figures of the drawing, sub-features and integral parts that correspond to one another bear the same reference symbol in each case. Referring now to the figures of the drawing in detail and first, particularly, to FIG. 1 thereof, there is shown a first illustrative embodiment formed of a starting material provided as a first substrate 1 made of silicon.

To produce a bottom sacrificial layer U, $SiO_2$ is deposited onto the first substrate 1 to a thickness of approximately 1 μm using a TEOS method and is patterned. In this case, a cutout is produced in a part of the bottom sacrificial layer U, the cutout extending as far as the first substrate 1.

Above the bottom sacrificial layer U, polysilicon is deposited to a thickness of approximately 5 μm in order to produce a material layer S (see FIG. 1). The cutout is filled in this process, with a support T being produced in the cutout. To produce a first mask 2, $SiO_2$ is deposited to a thickness of approximately 200 nm and is patterned by a photolithographic method.

The first mask 2 is used to produce first trenches G1, which run parallel to one another and have a width of approximately 1 μm, in a region of the material layer S in which a recess V is intended to be produced. The first trenches G1 are at a distance of approximately 1 μm from one another (see FIG. 1). The first trenches G1 extend as far as the bottom sacrificial layer U and are approximately 5 μm deep.

Next, a TEOS method is used to deposit a first filling layer F1 of $SiO_2$, which is approximately 600 nm thick. Parts of the first filling layer F1 which fill the first trenches G1 form first structures S1 (see FIG. 2). A width of the first structures S1 is approximately equivalent to a width of the first trenches G1.

Figure 2:
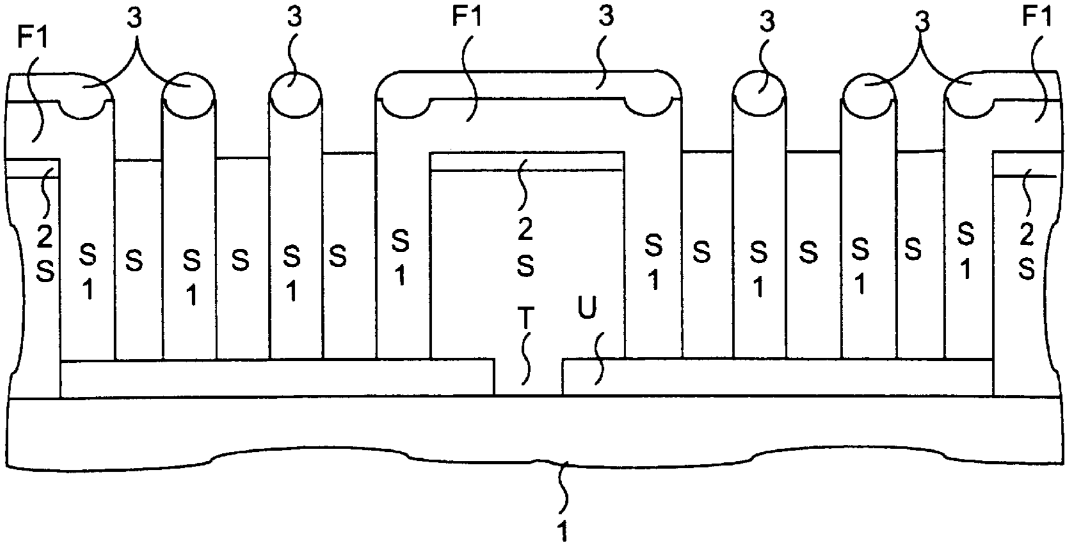
FIG. 2 is a cross-sectional view after first structures and a second mask have been produced as parts of a top sacrificial layer and parts of the first mask have been removed.

With the aid of a second, photoresist mask 3 which covers parts of the first filling layer F1 which are situated outside the recess to be produced and which also covers the first structures S1, parts of the first filling layer F1 and of the first mask 2 which are disposed in the region of the recess V to be produced are removed using hydrofluoric acid, for example (see FIG. 2). The second mask 3 is then removed.

Highly selective wet etching with choline, for example, is used to produce second trenches G2 between the first structures S1 by removing exposed parts of the material layer S selectively with respect to the first filling layer F1.

Figure 3:
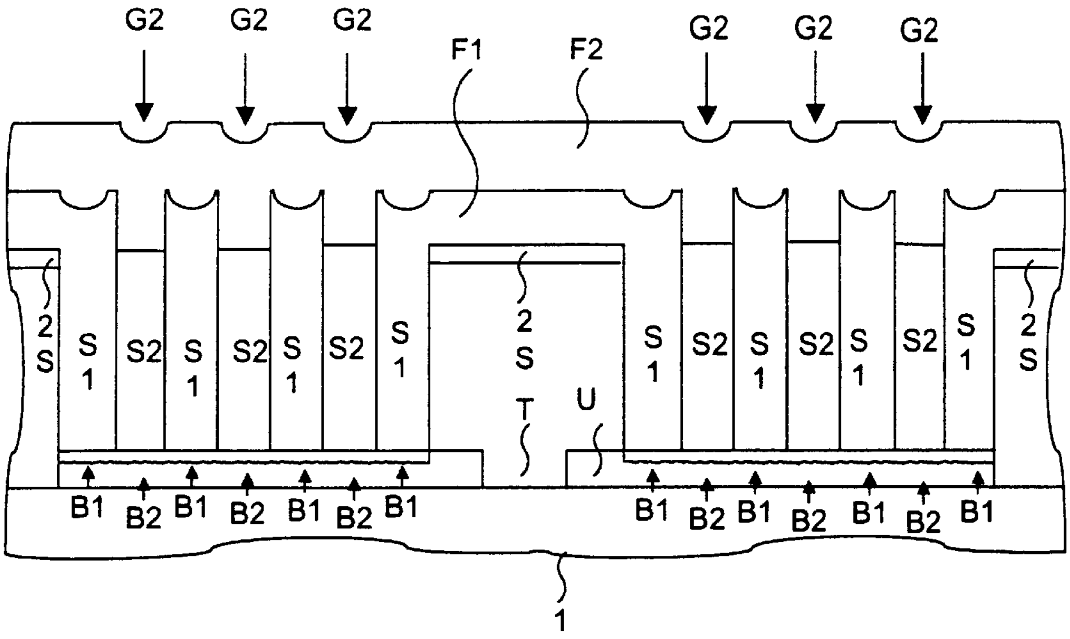
FIG. 3 is a cross-sectional view after parts of the layer have been removed and second structures have been produced as parts of the top sacrificial layer.

A TEOS method is used to deposit an approximately 1 μm thick second filling layer F2 of $SiO_2$. Parts of the second filling layer F2 which fill the second trenches G2 form second structures S2. The first filling layer F1 and the second filling layer F2 together form a top sacrificial layer. The first trenches G1 and the second trenches G2 together form the recess V. A bottom of the recess V has mutually adjacent first regions B1 and second regions B2, each of whose parts has respectively opposite edges whose distance from one another is shorter than a few μm. Disposed above each of the first regions B1 is one of the first structures S1. Disposed above the second regions B2 are the respective second structures S2. A bottom of the first trenches G1 coincides with the first regions B1. A bottom of the second trenches G2 coincides with the second regions B2. The recess V forms a semiconductor structure from the material layer S, the semiconductor structure being surrounded at the sides by walls defining the recess V. The semiconductor structure is approximately 50 μm wide and approximately 50 μm long. The support T connects it to the first substrate 1. A top face of the second filling layer F2 has grooves G which run along center lines of the second trenches G2 (see FIG. 3). The recess V has a horizontal cross section in which a circular plane having a diameter of approximately 7 μm fits.

Figure 4:
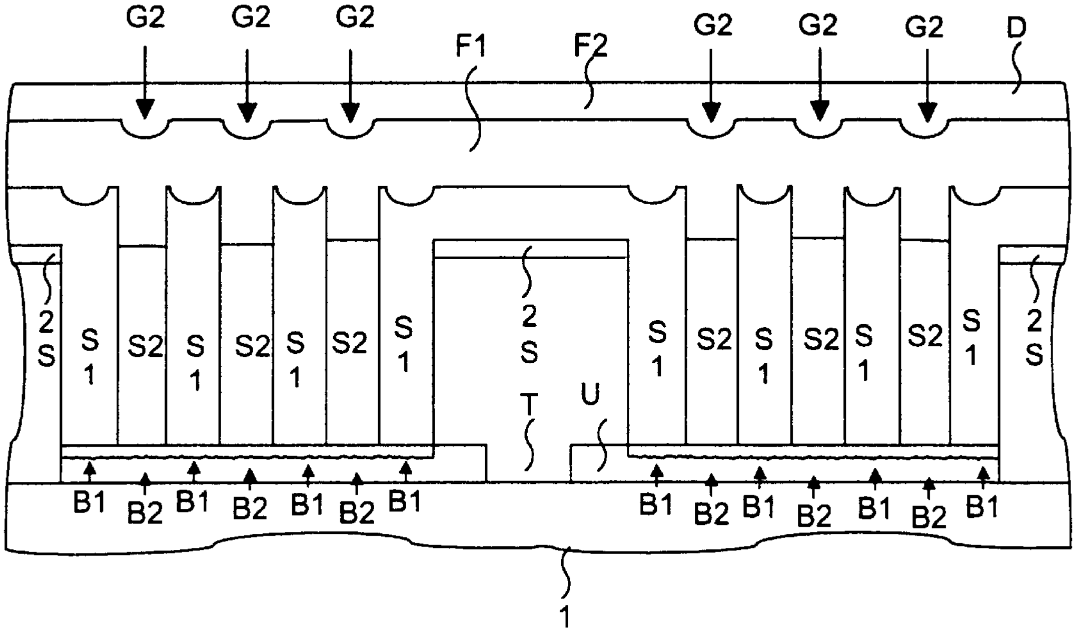
FIG. 4 is a cross-sectional view after a cover layer has been deposited.

To produce a cover structure D, polysilicon is deposited in a thickness of approximately 1 μm. The cover structure D in the region of the recess V has projections a in the form of ridges which run in the grooves G (see FIG. 4).

The projections a, which taper toward the bottom, are much smaller than the depth of the recess V and are disposed above the second regions B2 on the bottom of the recess V. The paths of the projections a essentially coincide with the paths of center lines of the second regions B2.

Figure 5:
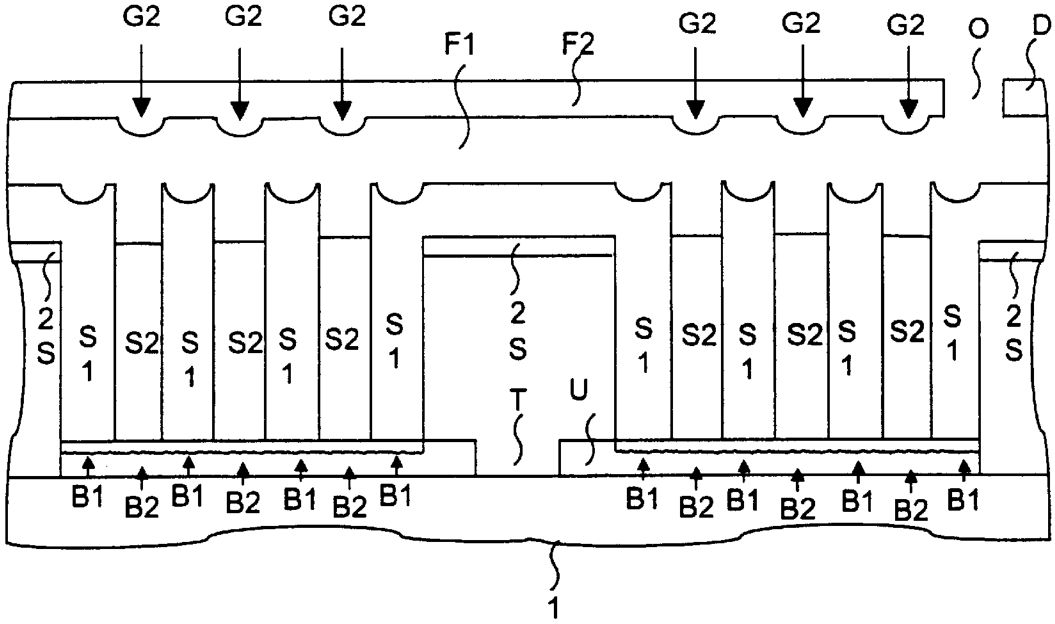
FIG. 5 is a cross-sectional view after an opening has been produced.
Figure 6:
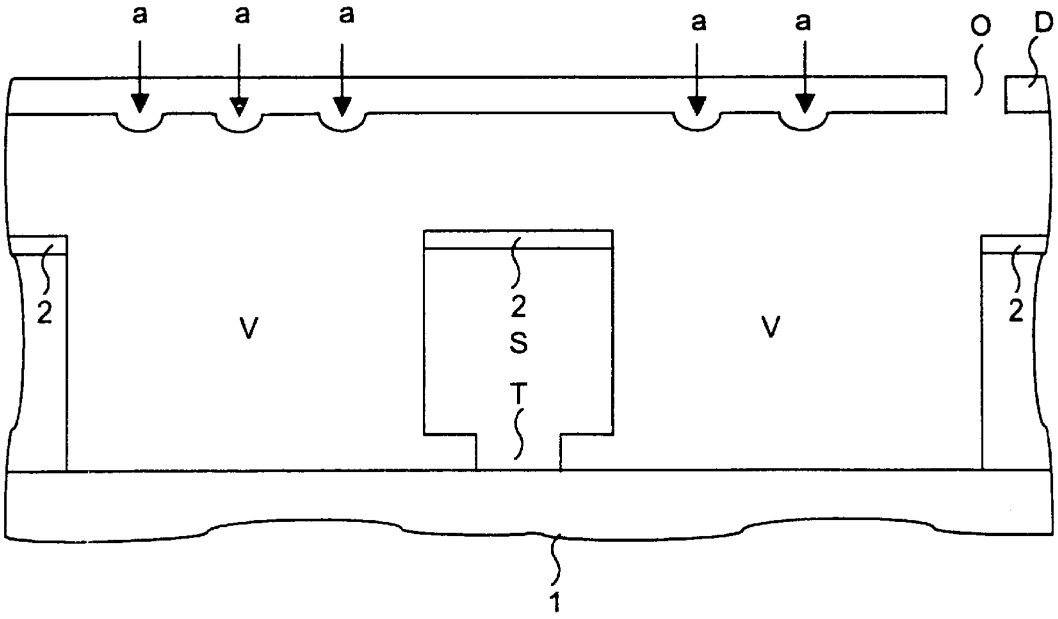
FIG. 6 is a cross-sectional view after a cavity-forming recess has been produced by removing the top sacrificial layer and the bottom sacrificial layer.

An opening O is produced in the cover structure D, the top sacrificial layer S1, S2, F1, F2 and the bottom sacrificial layer U being removed through the opening in an etching step. A suitable etchant is a buffered hydrofluoric acid, for example. The recess V forms part of a cavity that is bounded at the top by the cover structure D. The semiconductor structure can be made to oscillate by vibrations. The lateral freedom of movement is approximately 7 μm (see FIG. 5).

Figure 7:
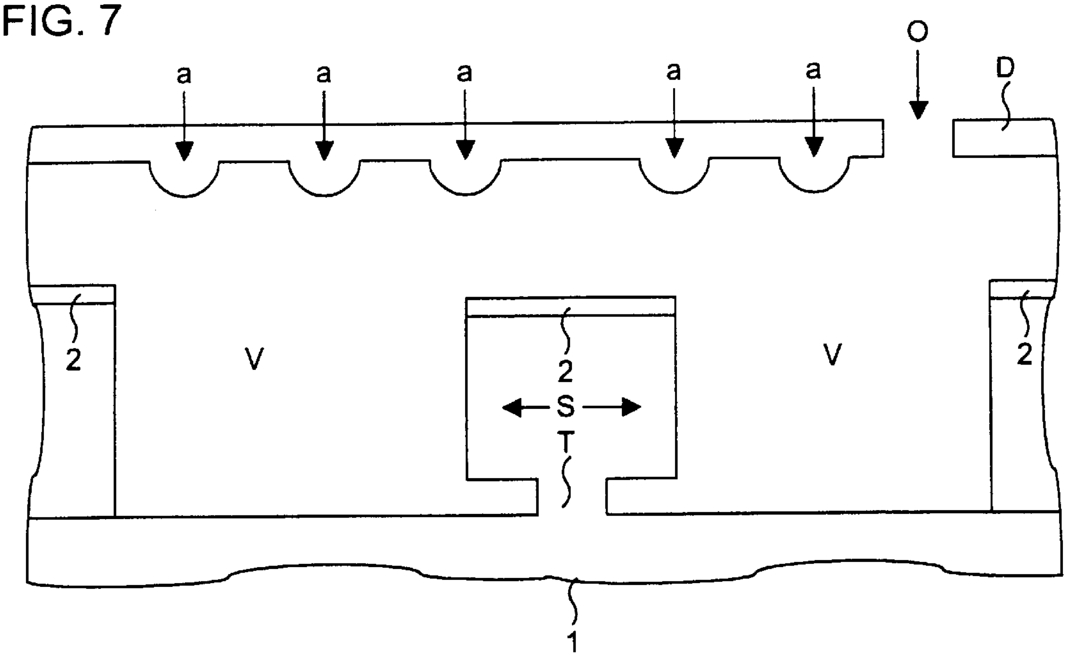
FIG. 7 is a cross-sectional view of the circuit configuration configured as an acceleration sensor.
Figure 8:
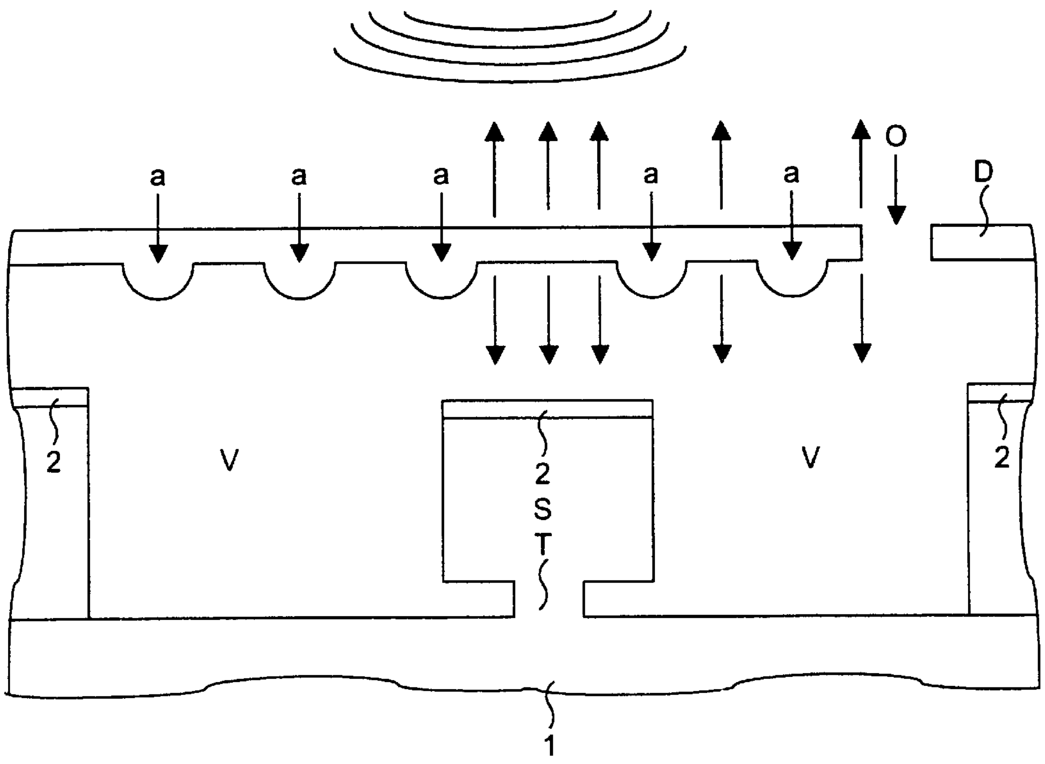
FIG. 8 is a cross-sectional view of the circuit configuration configured as a microphone.
Figure 9:
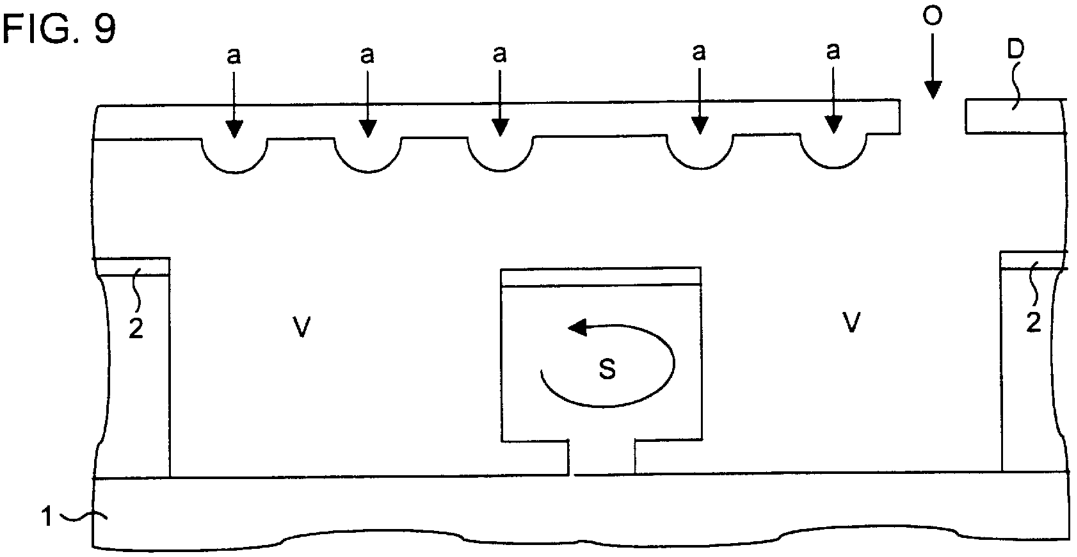
FIG. 9 is a cross-sectional view of the circuit configuration configured as a rotation rate sensor.

The circuit configuration is suitable as a rotation rate sensor, as illustrated in FIG. 9, or as an acceleration sensor, as illustrated in FIG. 7, or as a microphone as illustrated in FIG. B, for example. For such purposes, further components are disposed in the first substrate 1.

Many variations of the illustrative embodiment are conceivable which are likewise within the scope of the invention. Thus, dimensions of the structures, layers and semiconductor structures may be matched to the respective requirements. Recesses produced by the method described may also be used for other circuit configurations. Such circuit configurations are, by way of example, microphones, thermal sensors, pumps and valves for gases or liquids and integrated radio-frequency coils.

We claim:

1. An integrated circuit configuration, comprising:

a material layer having a recess and a circular plane having a diameter of a few μm formed therein, said recess having a depth of at least a few μm and a horizontal cross section with a sufficiently large diameter for fitting a said circular plane into said horizontal cross-section; and a cover structure disposed above and outside said recess for forming at least part of a cavity, said cover structure having a bottom face facing said recess, said bottom face having at least one projection tapering towards said bottom of said recess, said projection being smaller than said depth of said recess.

2. The circuit configuration according to claim 1, including a rotation rate sensor having a semiconductor structure with sides which can be made to oscillate laterally and is surrounded at said sides by said recess, and said recess forming part of said cavity.

3. The circuit configuration according to claim 1, including an acceleration sensor having a semiconductor structure with sides which can be made to oscillate laterally and is surrounded at said sides by said recess, and said recess forming part of said cavity.

4. The circuit configuration according to claim 1, including a microphone, said cover structure serving as a perforated electrode.

* * * * *